(12) United States Patent
Chen et al.

(10) Patent No.: US 7,652,278 B2
(45) Date of Patent: Jan. 26, 2010

(54) PROGRAMMABLE VIA STRUCTURE AND METHOD OF FABRICATING SAME

(75) Inventors: Kuan-Neng Chen, White Plains, NY (US); Lia Krusin-Elbaum, Dobbs Ferry, NY (US); Chung H. Lam, Peekskill, NY (US); Albert M. Young, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 416 days.

(21) Appl. No.: 11/612,631

(22) Filed: Dec. 19, 2006

(65) Prior Publication Data

US 2008/0142775 A1 Jun. 19, 2008

(51) Int. Cl.
*H01L 29/02* (2006.01)
*H01L 21/06* (2006.01)

(52) U.S. Cl. ............... 257/2; 257/E45.001; 438/95; 438/102

(58) Field of Classification Search .......... 257/2, 257/E29.068, E29.087, E45.001, E45.002; 438/84, 95
See application file for complete search history.

(56) References Cited

U.S. PATENT DOCUMENTS

2006/0278895 A1* 12/2006 Burr et al. ............. 257/209
2007/0099405 A1* 5/2007 Oliva et al. ............ 438/585
2007/0120104 A1* 5/2007 Ahn et al. .............. 257/2

* cited by examiner

Primary Examiner—Lex Malsawma
(74) Attorney, Agent, or Firm—Scully, Scott, Murphy & Presser, P.C.; Vazken Alexanlan (57) ABSTRACT

A programmable via structure is provided as well as a method of fabricating the same. The inventive programmable via a semiconductor substrate. An oxide layer such as a thermal oxide is located on a surface of the semiconductor substrate. A patterned heating material is located on a surface of the oxide layer. The inventive structure also includes a patterned dielectric material having a least one via filled with a phase change material (PCM). The patterned dielectric material including the PCM filled via is located on a surface of the patterned heating material. A patterned diffusion barrier is located on an exposed surface of said at least one via filled with the phase change material. The inventive structure also includes contact vias that extend through the patterned dielectric material. The contact vias are filled with a conductive material which also extends onto the upper surface of the patterned dielectric material. A conductive material which serves as the input of the device is located atop the patterned diffusion barrier that is located directly above the via that is filled with the phase change material.

20 Claims, 7 Drawing Sheets

PROGRAMMABLE VIA STRUCTURE AND METHOD OF FABRICATING SAME

This invention was made with U.S. Government support under Contract No. 66001-04-C-8032 awarded by the Defense Advanced Research Projects Agency (DARPA). As such, the U.S. Government has certain rights to this invention.

FIELD OF THE INVENTION

The present invention relates to a semiconductor structure and a method of fabricating the same. More particularly, the present invention relates to a semiconductor structure including a programmable via which contains a phase change material that is integrated with a heating element. The inventive structure provides a fast and reliable logic switching property medium as well as enabling the creation of a 3D integrated structure with enhanced functionality.

BACKGROUND OF THE INVENTION

Reconfigurable circuits have been widely used in the semiconductor industry for field programmable gate arrays (FPGAs) and for repair of a defective memory element. The FPGA consists of a set of simple, configurable logic blocks in an array with interspersed switches that can rearrange the interconnections between the logic blocks.

Reconfigurable circuits are also expected to play a significant role in three-dimensional (3D) integration technology that is being currently developed. 3D integration fabricates multilayer structures that can form a single chip combination with different functionalities. In these multilayer (and multifunctional) systems, reconfigurable circuit connection is typically needed to provide controllable logic functionality, memory repair, data encryption as well as other functions.

Phase change material based programmable vias propose to offer advantages such as, for example, spatial compactness, no need for latches, multiple-shot reprogrammability, and immunity from soft errors, with no requirement of high switching voltage or high switching power, both in FPGA and 3D integration applications.

In the prior art, the concept of a programmable link structure for use in 3D integrated semiconductor devices is proposed. Although such proposals have been made, there has been no disclosure of a semiconductor structure which describes the basic configuration of such devices, let alone a process sequence that can be used in forming the same.

SUMMARY OF THE INVENTION

The present invention provides a programmable via structure which includes a via filled with a phase change material (PCM) which is in close proximity to a heating device. The heating device is typically configured to switch the conductivity of a transformable portion of the PCM between a lower resistance crystalline state and a higher resistance amorphous state. As such, the via defines a programmable link between an input connection located at one end of the structure and an output connection located at another end of the structure.

Specifically, the present invention provides a programmable via structure which includes:

a semiconductor substrate;

an oxide layer located on a surface of said semiconductor substrate;

a patterned heating material located on a surface of said oxide layer;

a patterned dielectric material having a least one via filled with a phase change material located on a surface of said patterned heating material, said phase change material having a lower surface that is in direct contact with a portion of said patterned heating material; and a patterned diffusion barrier located on an exposed surface of said at least one via filled with said phase change material.

The inventive structure also includes contact vias that extend through the patterned dielectric material. The contact vias are filled with a conductive material which also extends onto the upper surface of the patterned dielectric material. A conductive material which serves as the input of the device is located atop the patterned diffusion barrier material that is located directly above the via that is filled with the phase change material.

In a preferred embodiment of the present invention, the inventive structure comprises:

a Si-containing semiconductor substrate;

a thermal oxide layer located on a surface of said Si-containing semiconductor substrate;

a patterned $Ta_xSi_yN_z$ (x, y, z are 0~1) material located on a surface of said thermal oxide layer;

a patterned oxide material having a least one via filled with $Ge_2Sb_2Te_5$ or GeSb (both can be either pure material or doped with N or Si) located on a surface of said patterned $Ta_xSi_yN_z$ (x, y, z are 0~1) material, wherein said $Ge_2Sb_2Te_5$ or GeSb (both can be either pure material or doped with N or Si) has a lower surface that is in direct contact with a portion of said patterned $Ta_xSi_yN_z$ (x, y, z: 0~1) material; and a patterned TiN/Ti or TaN/Ta diffusion barrier located on an exposed surface of said at least one via filled with $Ge_2Sb_2Te_5$ or GeSb (both can be either pure material or doped with N or Si).

The preferred structure also includes contact vias that extend through the patterned dielectric material. The contact vias are filled with W or Cu which also extends onto the upper surface of the patterned oxide material. W or Cu which serves as the input of the device is located atop the patterned diffusion barrier material that is located directly above the via that is filled with $Ge_2Sb_2Te_5$ or GeSb (both can be either pure material or doped with N or Si).

In the inventive structure, the phase change material of the programmable via structure can be switched between a resistive state and a conductive state by the buried heating material that is located beneath the via including the phase change material during a programmed heating cycle. A typical programmed heating cycle includes: 1. heating the PCM in the via above its melting temperature, which is usually higher than about 600° C. by applying a rapid high current (voltage) pulse in the heating material, for example, a few nano seconds, to the high resistance state. 2. heating the PCM in the via below its melting temperature, which is usually from about 100° to about 600° C. by applying a wide low current (voltage) pulse in the heating material, for example, a few micron seconds, to the low resistance state.

In addition to a programmable via structure, the present invention also provides a method of fabricating the same. The inventive method includes:

providing a patterned heating material on a surface of an oxide layer, said oxide layer is located above a semiconductor substrate;

forming a patterned dielectric material having a least one via on a surface of said patterned heating material;

filling said at least one via with a phase change material such that a lower surface of said phase change material is in direct contact with a portion of said patterned heating material; and forming a patterned diffusion barrier on an exposed surface of said at least one via filled with said phase change material.

The inventive method also includes forming contact vias that extend through the patterned dielectric material. The contact vias are then filled with a conductive material which also extends onto the upper surface of the patterned dielectric material. A conductive material which serves as the input of the device is located atop the diffusion barrier material that is located directly above the via that is filled with the phase change material.

DETAILED DESCRIPTION OF THE INVENTION

The present invention, which provides a programmable via structure and a method of fabricating the same, will now be described in greater detail by referring to the following discussion and drawings that accompany the present application. It is noted that the drawings of the present application are provided for illustrative purposes and, as such, they are not necessarily drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As stated above, the present invention provides a semiconductor structure including a programmable via and a method of fabricating the same.

Figure 1:
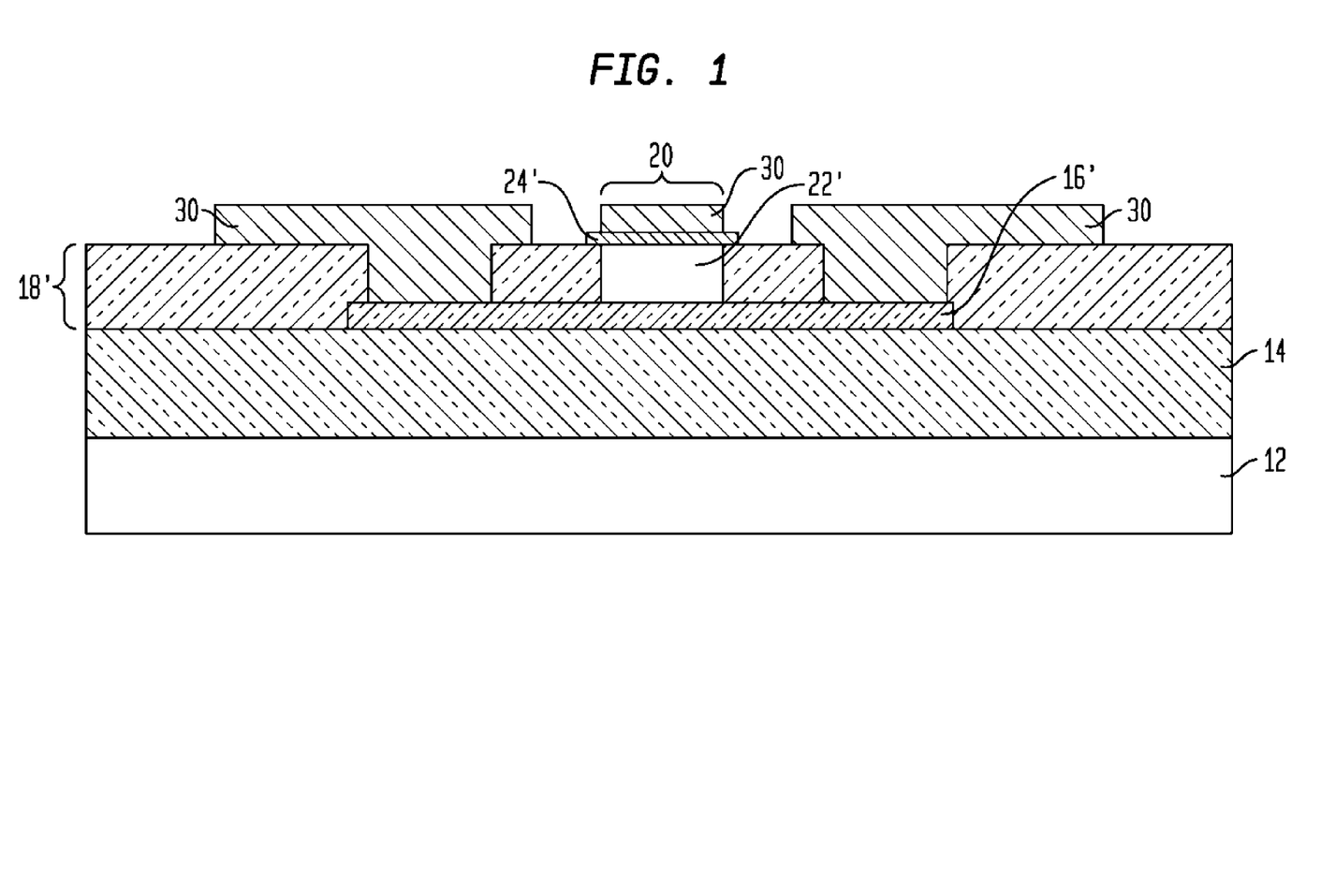
FIG. 1 is a pictorial representation (through a cross sectional view) illustrating the semiconductor structure of the present invention.

As shown in FIG. 1, the inventive structure includes a semiconductor substrate 12 such as, for example, a Si-containing semiconductor substrate. An oxide layer 14 such as a thermal oxide is located on a surface of the semiconductor substrate 12. A patterned heating material 16' is located on a surface of the oxide layer 14. The patterned heating material 16' is typically comprised of a silicide such as, for example, TaSiN.

The inventive structure also includes a patterned dielectric material 18' having a least one via 20 filled with a phase change material (PCM) 22'. The patterned dielectric material 16' including the PCM filled via is located on a surface of the patterned heating material 16'. In the inventive structure, a lower surface of the PCM 22' is in direct contact with a portion of said patterned heating material 16'. A patterned diffusion barrier 24' is located on an exposed surface of said at least one via 20 filled with the phase change material 22'

The inventive structure also includes contact vias 26 that extend through the patterned dielectric material 18'. The contact vias 26 are filled with a conductive material 30 which also extends onto the upper surface of the patterned dielectric material 18'. A conductive material 30 which serves as the input of the device is located atop the patterned diffusion barrier 24' that is located directly above the via 20 that is filled with the phase change material 22.

The phase change material 22' of the programmable via structure shown in FIG. 1 can be switched between a resistive state and a conductive state by the buried heating material 16' that is located beneath the via 20 including the phase change material 22' during a programmed heating cycle.

Figure 2A:
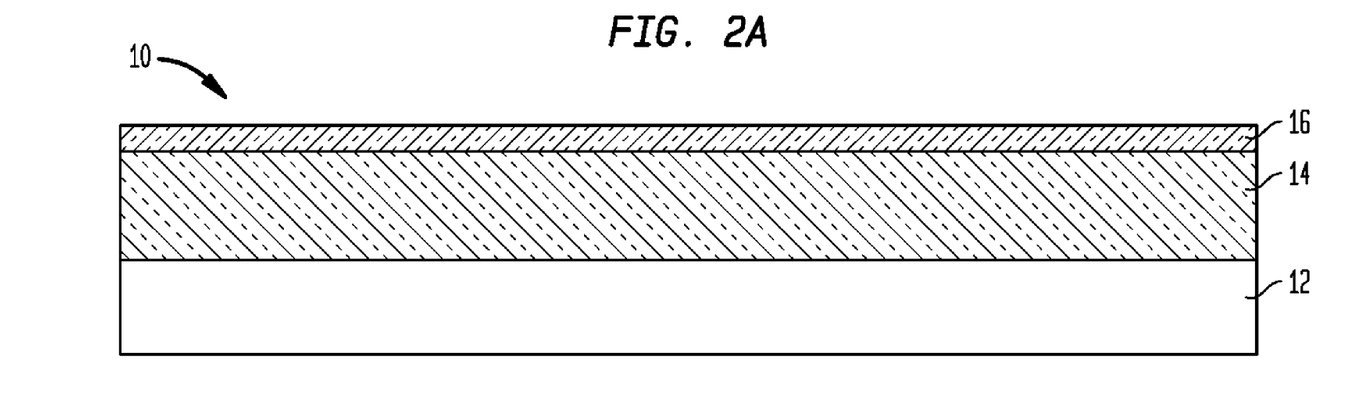
FIGS. 2A-2J are pictorial representations (through cross sectional views) depicting the basic processing steps of the present invention which lead to the formation of the inventive structure shown in FIG. 1.

Reference is now made to FIGS. 2A-2J which illustrate the basic processing steps that are used in subsequently forming the inventive semiconductor structure shown in FIG. 1. Specifically, FIG. 2A illustrates an initial structure 10 that is employed in the present invention. As shown, the initial structure 10 includes a semiconductor substrate 12, an oxide layer 14 located on an upper surface of the semiconductor substrate 12, and a heating material 16 located on an upper surface of the oxide layer 14.

The initial structure 10 shown in FIG. 2A is made by first providing the semiconductor substrate 12. The term "semiconductor substrate" as used herein refers to any material having semiconductor properties. Illustratively, the semiconductor substrate 12 comprises Si, SiGe, SiGeC, SiC, Ge alloys, GaAs, InAs, InP as well other III-V or II-VI compound semiconductors. The semiconductor substrate 12 may also comprise a layered semiconductor such as, for example, Si/SiGe, a silicon-on-insulator (SOI) or a SiGe-on-insulator (SGOI). Preferably, the semiconductor substrate 12 is composed of a Si-containing semiconductor material, i.e., a semiconductor material that includes silicon.

The semiconductor substrate 12 may comprise a single crystal orientation or it may be a hybrid semiconductor substrate having surface regions of different crystal orientation. The semiconductor substrate 12 may include a strained semiconductor material, an unstrained semiconductor or a combination of strained and unstrained semiconductor materials are also within the scope of the instant invention. The semiconductor substrate 12 may be doped, undoped or contain doped and undoped regions (not specifically shown) therein.

If other devices are present, such as field effect transistors and/or bipolar transistors, one or more isolation regions such as trench isolation regions and/or field oxide isolation regions may be present. When such isolation regions are present, conventional techniques well known to those skilled in the art can be used in forming the same. In the drawings that accompany the present application, no other types of devices are shown.

The oxide layer 14 is then formed on an upper surface of the semiconductor substrate 12. Preferably, the oxide layer 14 is a thermal oxide that is formed utilizing a conventional oxidation process. Although a thermal oxide is preferred as layer 14, layer 14 may also be an oxide that is formed by a conventional deposition process including, for example, chemical vapor deposition (CVD), plasma enhanced chemical vapor deposition (PECVD), atomic layer deposition (ALD), chemical solution deposition and evaporation. Notwithstanding the technique used in forming layer 14, oxide layer 14 typically has a thickness from about 5 to about 2000 nm, with a thickness from about 100 to about 500 nm being even more typical.

After forming the oxide layer 14 on an upper surface of substrate 12, heating material 16 is then formed on the upper surface of the oxide layer 14. The term "heating material" is used throughout the present application to denote any material (typically and oxide and/or nitride) whose resistivity is higher than the resistivity of the metal wiring to be subsequently formed. Typically, the heating material 16 employed in the present invention has a resistivity from about 100 to about 10000 ohm cm with a resistivity from about 500 to about 3000 ohm cm being even more typical. In one preferred embodiment of the present invention, the heating material 16 is a silicided nitride such as, for example, TaSiN, having a resistivity of about 2000 ohm cm. In another embodiment, the heating material 16 is an oxide such as, for example, $CrO_2$ or $RuO_2$. In a highly preferred embodiment of the present invention, $Ta_xSi_yN_z$ (where x, y and z are 0 to approximately 1) is used as the heating material 16.

The heating material 16 is formed utilizing techniques well known to those skilled in the art. For example, the heating material 16 can be formed utilizing a sputtering technique including, for instance, physical vapor deposition (PVD).

The heating material 16 employed in the present invention has a thickness from about 5 to about 100 nm, with a thickness from about 10 to about 50 nm being more preferred.

Figure 2B:
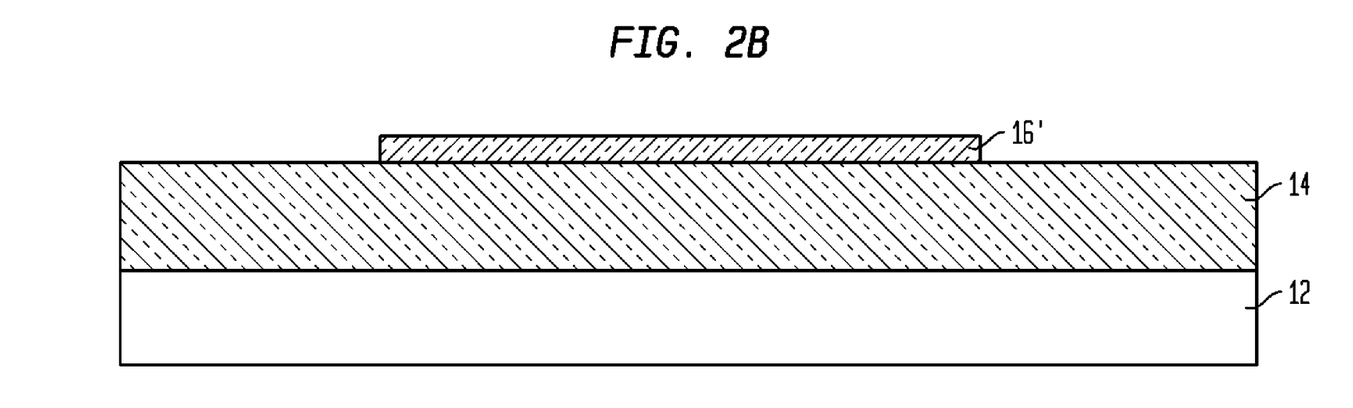

After providing the initial structure 10 shown in FIG. 2A, the heating material 16 is patterned to provide a patterned heating material 16' located on a surface of the oxide layer 14 such as is shown, for example, in FIG. 2B. The patterning of the heating material 16 is achieved by first applying a conventional photoresist (not shown) to the heating material 16 shown in FIG. 2A. After application of the photoresist to the heating material 16, the photoresist is subjected to a lithographic step that includes pattern wise exposure of the photoresist to a desired pattern of radiation and development of the exposed photoresist utilizing a conventional resist developer. The patterned photoresist protects a portion of the heating material 16, while leaving at least one other portion unprotected. The unprotected portions of the heating material 16, not including the patterned resist, are then removed by etching. Any etching process that removes the unprotected portions of the heating material 16 selective to the patterned resist can be used. Typically, a reactive ion etching (RIE) process or another like dry etching process is used. As shown, the etching process stops atop the upper surface of the oxide layer 14.

The photoresist used in forming the patterned heating material 16' is typically stripped after the etching process.

Figure 2C:
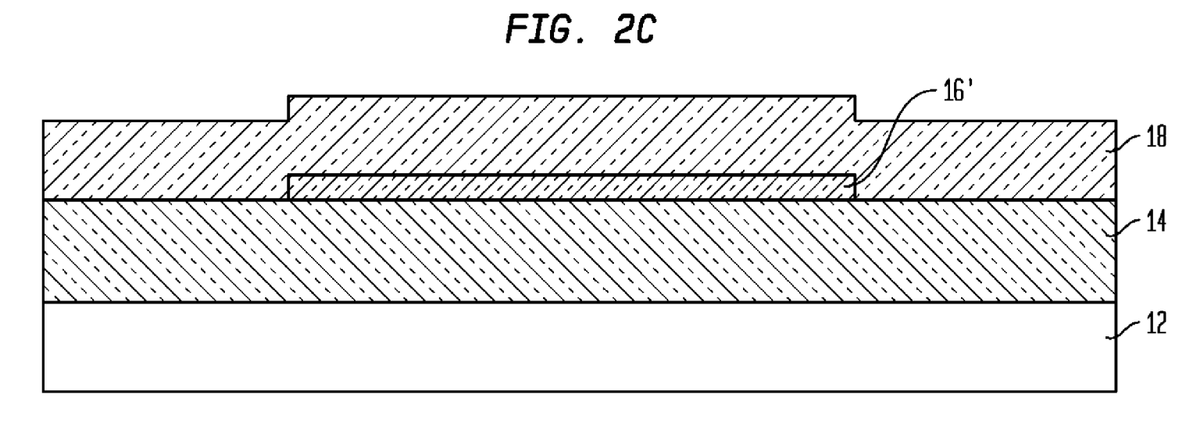

After providing the structure shown in FIG. 2B, a dielectric material 18 is formed on all exposed surfaces of the structure including the oxide layer 14 and the patterned heating material 16' providing the structure shown in FIG. 2C. The dielectric material 18 comprises any insulating material including oxides, nitrides, oxynitrides and multilayers thereof. Preferably, an oxide such as, for example, silicon dioxide is employed as dielectric material 18.

As is shown, the dielectric material 18 covers the upper surfaces of both the exposed portions of oxide layer 14 as well as the upper and sidewall surfaces of the patterned heating material 16'. The dielectric material 18 is formed utilizing a conventional deposition process including for example, CVD, PECVD, ALD, evaporation, and chemical solution deposition. In some embodiments, the dielectric material 18 may be formed by a thermal process as long as the thermal process does not adversely affect the properties of the patterned heating material 16'.

The thickness of the dielectric material 18 may vary depending on the type of dielectric material employed as well as the technique that is used in forming the same. The thickness is decided functionally by the selection of PCM material, which decides the size of PCM via.

Figure 2D:
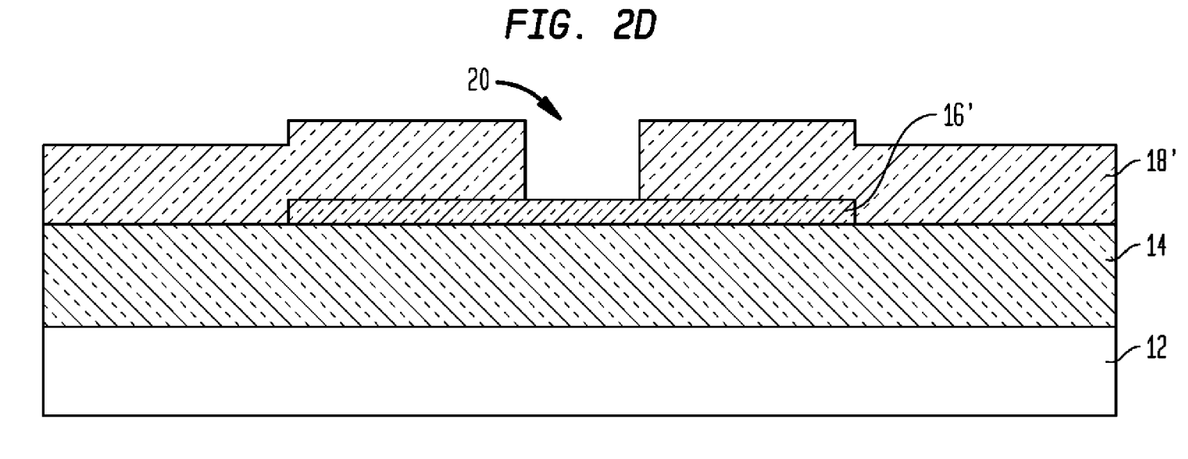

A via 20 is then formed into the dielectric material 18 exposing a portion of the patterned heating material 16' such as is shown, for example, in FIG. 2D. The via 20 is formed by lithography and etching. The lithographic step includes the same basic processing steps described above for forming the patterned heating material 16'. The etching includes any etching process the removes dielectric material 18 selective to the photoresist employed. Typically, RIE is used. The width of the via may vary and is generally within typical lithographic limits. It is noted that although the present invention is described with respect to forming a single via 20, the present invention contemplates forming a plurality of such vias, each of which exposes an underlying patterned heating material. It is noted that during this step of the present invention dielectric material 18 is patterned forming patterned dielectric material 18'.

Figure 2E:
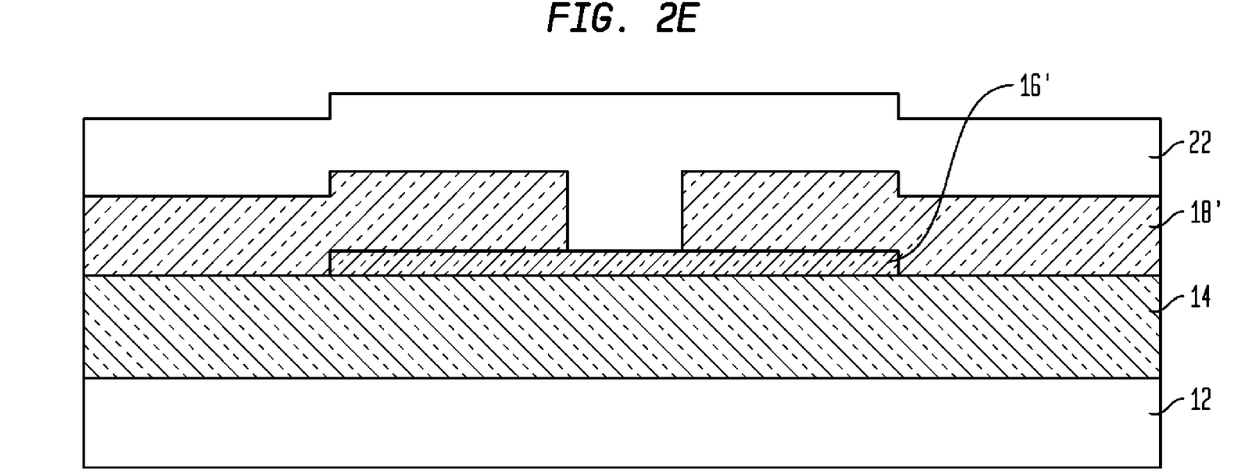

FIG. 2E illustrates the structure that is formed after providing a phase change material (PCM) 22 to the structure shown in FIG. 2D. As is illustrated, the PCM 22 fills via 20 and covers the exposed surfaces of the patterned dielectric material 18'. Within the via 20 itself, the PCM 22 is in direct contact with an underlying portion of the patterned heating material 16'.

The PCM 22 is a material having electrical properties (e.g., resistance, capacitance, etc.) that may be changed through the application of energy such as, for example, heat, light, voltage potential, or electrical current. Examples of a PCM include a chalcogenide material or a chalcogenide alloy. A chalcogenide material is a material that includes at least one element from Group VIB (IUPAC nomenclature) of the Periodic Table of Elements, i.e., any of the elements of tellurium, sulfur, or selenium. The chalcogenide may be a pure material or it can be doped with N and/or Si. In a preferred embodiment of the present invention, the PCM 22 is comprised of $Ge_2Sb_2Te_5$ or GeSb.

The PCM 22 is formed utilizing a deposition process including, for example, CVD, PECVD, chemical solution deposition, sputtering, and evaporation. The thickness of the as deposited PCM 22 may vary. Typically, the as deposited thickness of the PCM 22 is from about 5 to about 1000 nm, with a thickness from about 10 to about 500 nm being even more typical.

Figure 2F:
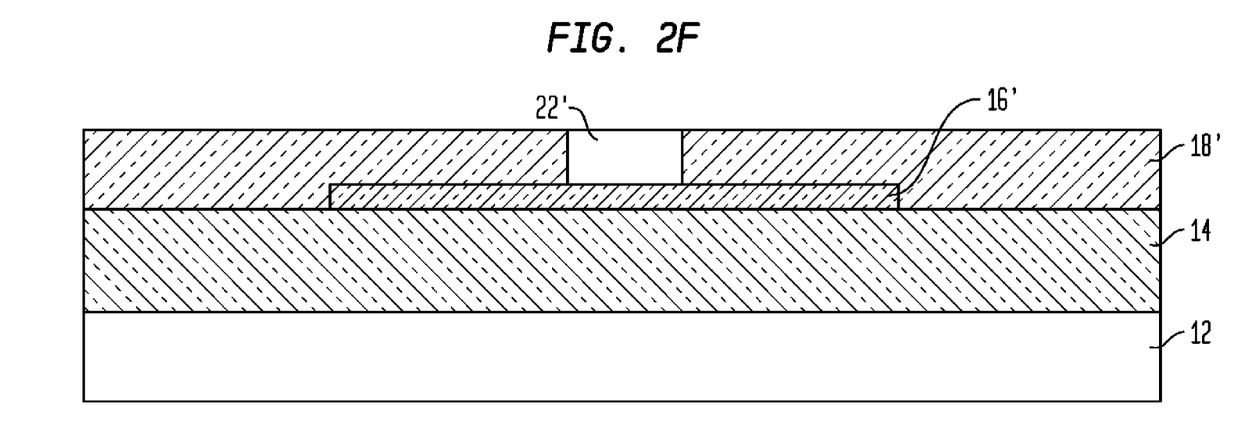

The structure shown in FIG. 2E is then subjected to a planarization process that removes the PCM material 22 that is located outside the via 20 providing the structure shown, for example, in FIG. 2F. As is shown, the PCM 22' remaining after planarization has an upper surface that is substantially coplanar to the upper surface of the patterned dielectric material 18'. Any conventional planarization process including chemical mechanical planarization (CMP) and/or grinding may be employed.

Figure 2G:
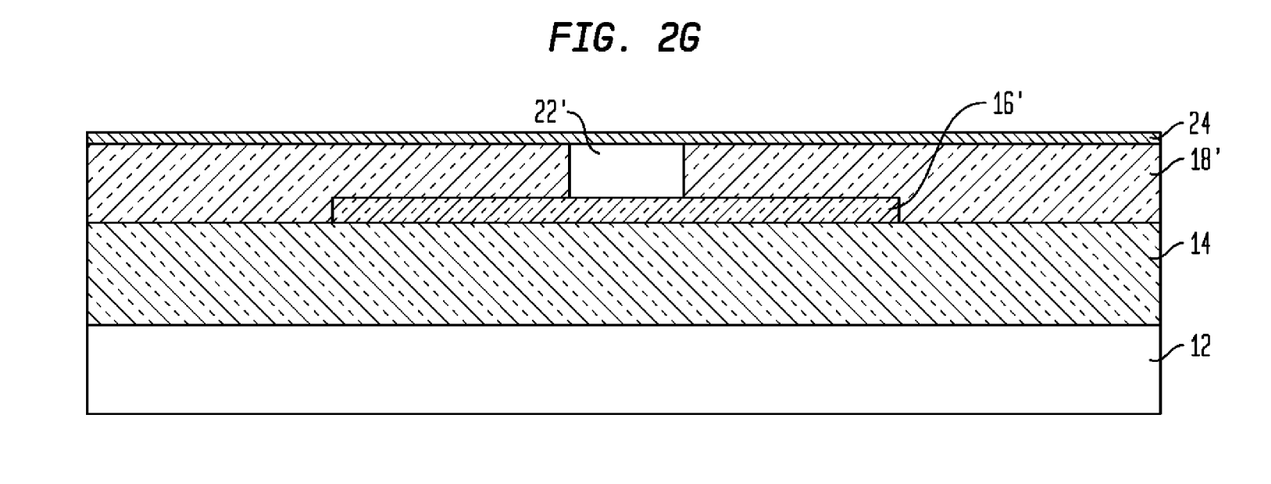

After planarization, a diffusion barrier layer 24 is formed atop the upper surfaces of the patterned dielectric material 18' as well as the PCM 22' that remains in via 20 providing the structure shown, for example, in FIG. 2G. The diffusion barrier layer 24 comprises any material which prevents diffusion of contaminates into the PCM filled via. The diffusion barrier layer 24 comprises at least one of Ta, TaN, Ti, TiN, Ru, ZrN and RuN. Typically, a stack of TiN/Ti or TaN/Ta is employed as the diffusion barrier layer 24.

The diffusion barrier layer 24 is formed utilizing a conventional deposition process including, for example, CVD, PECVD, sputtering, evaporation, chemical solution deposition and plating. The thickness of the diffusion barrier layer 24 may vary depending on the material of the layer as well as the technique used in forming the same. Typically, the diffusion barrier layer 24 has a thickness from about 1 to about 100 nm, with a thickness from about 10 to about 50 nm being even more typical.

Figure 2H:
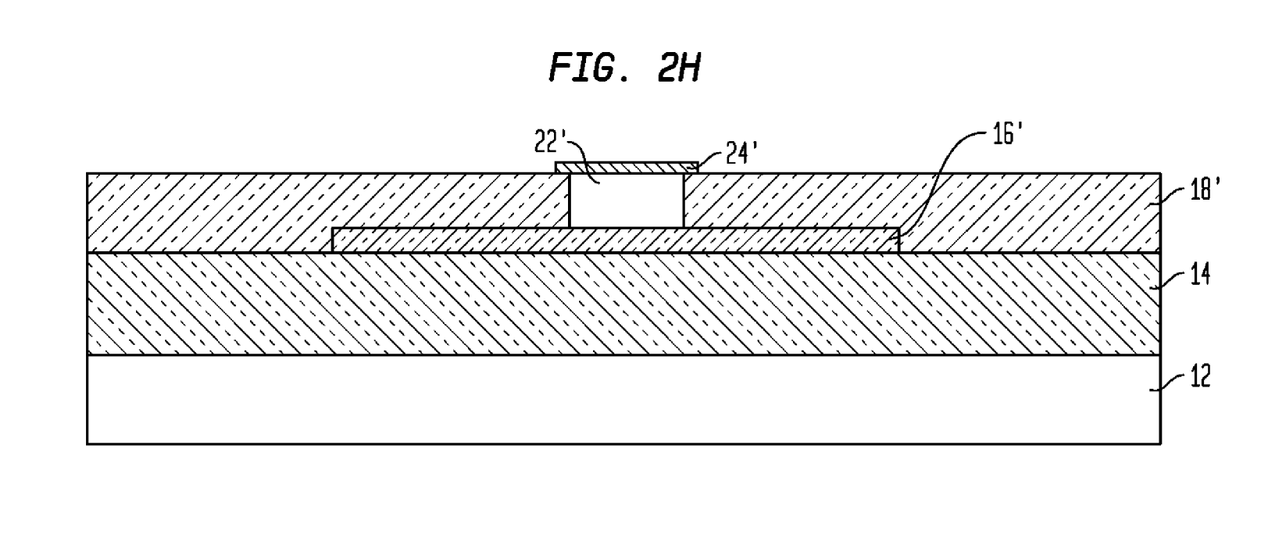

FIG. 2H illustrates the structure after the diffusion barrier layer 24 has been patterned by lithography and etching forming patterned diffusion barrier layer 24' located atop the PCM filled via. In some embodiments, the patterned diffusion barrier layer 24' may extend onto a surface of the patterned dielectric material 18' that lies adjacent to the PCM filled via. The lithographic step is the same as described above. The etching process used at this point of the invention removes the exposed barrier layer 24 selective to the patterned photoresist. RIE or another like dry etching process can be employed to etch and subsequently pattern the diffusion barrier layer 24.

Figure 2I:
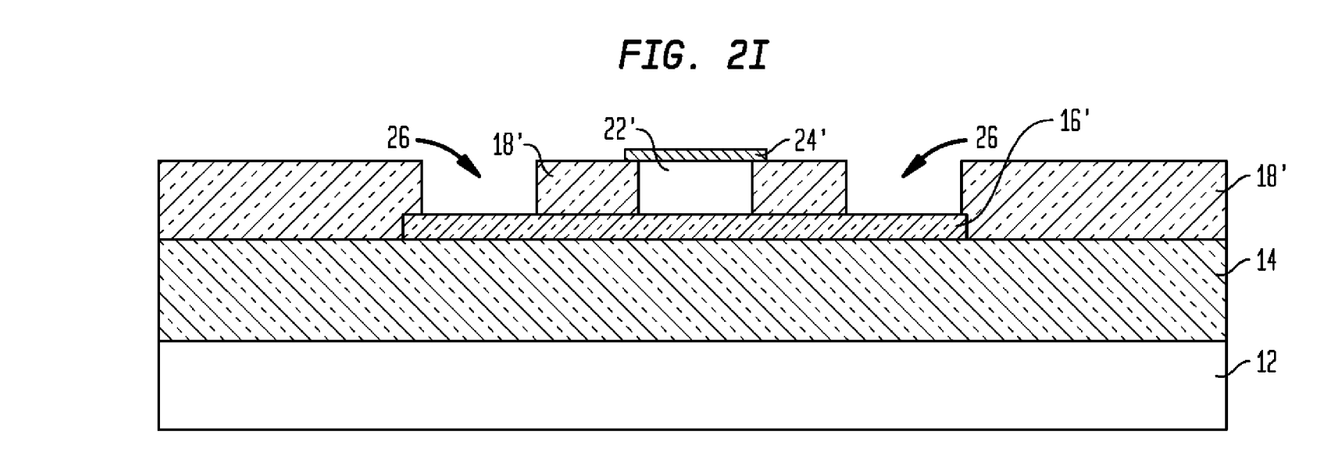

FIG. 2I shows the structure that is formed after forming contact vias 26 into the patterned dielectric material 18'. The contact vias 26 are formed utilizing the same processing technique used in forming via 20. As is shown, the etching of the contact vias 26 stops on an exposed upper surface of the patterned heating material 16'.

Figure 2J:
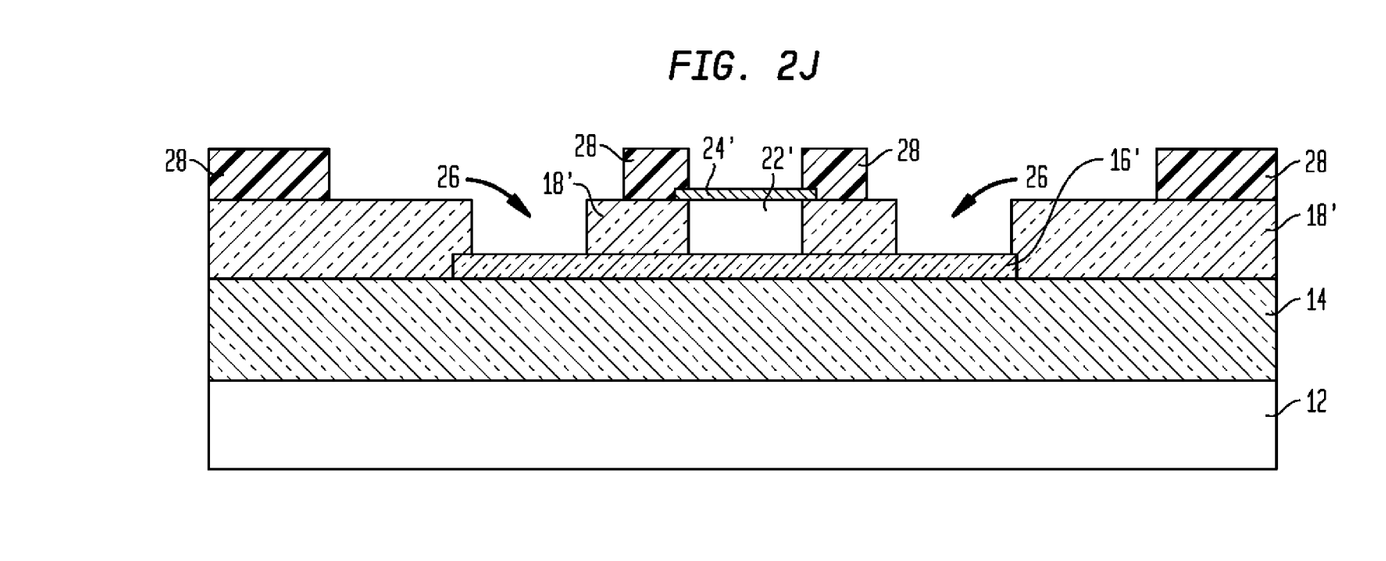

FIG. 2J illustrates the structure that is formed after forming patterned photoresist pads 28 on the exposed upper surface of the patterned dielectric material 18. The patterned photoresist pads 28 are formed by application of a blanket layer of photoresist material to the structure shown in FIG. 2I, exposing the blanket layer of photoresist material to radiation and developing the exposed resist utilizing a conventional resist developer.

A conductive metal 30 is then deposited filling the contact vias 26 and covering the exposed surfaces of the dielectric material not protected by the patterned photoresist pads 28. The conductive metal which forms the conductive wiring of the inventive structure comprises an elemental metal such as for example, W, Cu, Al or alloys thereof such AlCu. Preferably, W is used as the conductive metal 30. The conductive metal 30 is formed utilizing any conventional deposition process including, for example, CVD, PECVD, chemical solution deposition, plating, sputtering and evaporation.

As is shown in the drawings, a conductive material 30 is also present atop the patterned diffusion barrier 24' which serves as an input for the inventive structure.

Next, a conventional lift off process is used to remove the patterned photoresist pads 28 from the structure providing the inventive structure shown in FIG. 1.

Figure 3A:
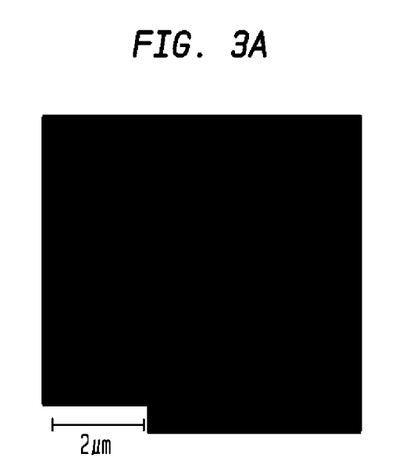
FIGS. 3A-3B are SEM images (top and cross sectional) showing the inventive structure after formation of vias 20 into dielectric material 18.
Figure 3B:
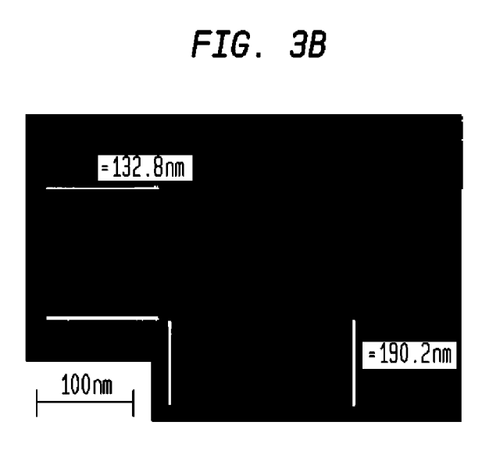
Figure 4:
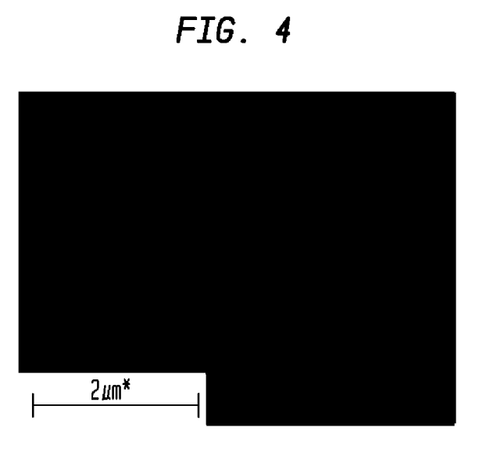
FIG. 4 is an SEM image (top down view) after filling the vias 20 with PCM 22 and planarization.
Figure 5:
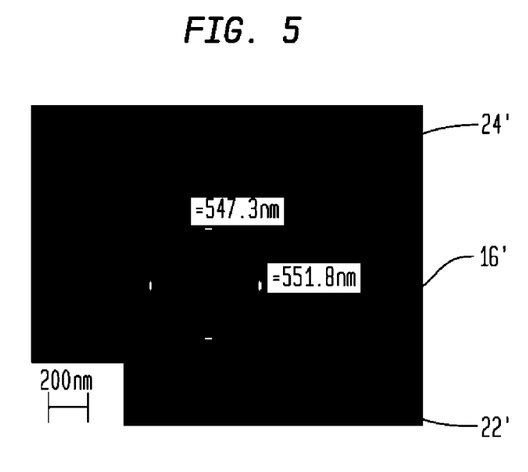
FIG. 5 is an SEM image (top down view) illustrating the structure after forming the diffusion barrier layer 24 atop the structure shown for example in FIG. 4.

Reference is now made to FIGS. 3A-5 which are SEM images during various stages of the inventive process. Specifically, FIGS. 3A-3B are SEM images (top and cross sectional) showing the inventive structure after formation of vias 20 into dielectric material 18, FIG. 4 is an SEM image (top down view) after filling the vias 20 with PCM 22 and planarization, and FIG. 5 is an SEM image (top down view) illustrating the structure after forming the diffusion barrier layer 24'.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor structure comprising
   a semiconductor substrate;
   an oxide layer located on a surface of said semiconductor substrate;
   a patterned heating material located on a surface of said oxide layer;
   a patterned dielectric material having a least one via filled with a phase change material located on a surface of said patterned heating material, said phase change material having a lower surface that is in direct contact with a portion of said patterned heating material; and
   a patterned diffusion barrier located on an exposed surface of said at least one via filled with said phase change material.

2. The semiconductor structure of claim 1 further comprising contact vias that extend through the patterned dielectric material, said contact vias are filled with a conductive material which also extends onto the upper surface of the patterned dielectric material.

3. The semiconductor structure of claim 1 further comprising a conductive material located atop the patterned diffusion barrier material that is located directly above the via that is filled with said phase change material.

4. The semiconductor structure of claim 1 wherein said phase change material includes a chalcogenide material or a chalcogenide alloy.

5. The semiconductor structure of claim 4 wherein said phase change material is comprised of $Ge_2Sb_2Te_5$ or GeSb.

6. The semiconductor structure of claim 1 wherein said diffusion barrier comprises at least one of Ta, TaN, Ti, TiN, Ru, ZrN and RuN.

7. The semiconductor structure of claim 6 wherein said diffusion barrier is a stack of TiN/Ti or TaN/Ta.

8. The semiconductor structure of claim 1 wherein said patterned heating material is a nitride or oxide with sufficiently high resistivity.

9. The semiconductor structure of claim 8 wherein said patterned heating material is $Ta_xSi_yN_z$ (x, y, z are 0~1), $CrO_2$, $RuO_2$.

10. A semiconductor structure comprising:
    a Si-containing semiconductor substrate;
    a thermal oxide layer located on a surface of said Si-containing semiconductor substrate;
    a patterned TaSiN material located on a surface of said thermal oxide layer;
    a patterned oxide material having a least one via filled with $Ge_2Sb_2Te_5$ or GeSb located on a surface of said patterned TaSiN material, said $Ge_2Sb_2Te_5$ or GeSb having a lower surface that is in direct contact with a portion of said patterned TaSiN material; and
    a patterned TiN/Ti diffusion barrier located on an exposed surface of said at least one via filled with $Ge_2Sb_2Te_5$ or GeSb.

11. The semiconductor structure of claim 10 further comprising contact vias that extend through the patterned dielectric material, said contact vias are filled with W which also extends onto the upper surface of the patterned oxide material.

12. The semiconductor structure of claim 10 further comprising W located atop the patterned TiN/Ti diffusion barrier.

13. A method of fabricating a semiconductor structure comprising:
provoding a patterned heating material on a surface of an oxide layer, said oxide layer is located above a semiconductor substrate;
forming a patterned dielectric material having a least one via on a surface of said patterned heating material;
filling said at least one via with a phase change material such that a lower surface of said phase change material is in direct contact with a portion of said patterned heating material; and
forming a patterned diffusion barrier on an exposed surface of said at least one via filled with said phase change material.

14. The method of claim 13 wherein said oxide layer is a thermal oxide which is formed by a thermal oxidation process.

15. The method of claim 13 wherein providing said patterned heating material comprises the steps forming a layer of heating material on said oxide layer, forming a patterned photoresist on said layer of heating material, performing an etching process that selectively removes exposed portions of the heating material relative to said patterned photoresist and stripping said photoresist.

16. The method of claim 13 wherein said filling said at least one via with said phase change material comprises the steps of deposition of said phase change material and planarizing said phase change material such that an upper surface thereof is substantially coplanar with an upper surface of said patterned dielectric material.

17. The method of claim 13 further comprising forming contact vias that extend through the patterned dielectric material, forming patterned photoresist pads on portions of said patterned dielectric material, filling said contact vias with a conductive material which also extends onto the upper surface of the patterned dielectric material; and removing said patterned photoresist pads from said patterned dielectric material.

18. The method of claim 17 wherein said removing of said patterned photoresist pads comprises a lift off procedure.

19. The method of claim 17 wherein said conductive material is formed atop the patterned diffusion barrier material that is located directly above the via that is filled with said phase change material.

20. The method of claim 13 comprising switching the phase change material between resistive and conductive states by subjecting said patterned heating material to a programmed heating cycle.

* * * * *